United States Patent
Odaka et al.

(10) Patent No.: US 11,150,315 B2
(45) Date of Patent: Oct. 19, 2021

(54) MAGNETIC RESONANCE IMAGING APPARATUS AND METHOD FOR CONTROLLING THE SAME

(71) Applicant: Hitachi, Ltd., Tokyo (JP)

(72) Inventors: Akihiro Odaka, Tokyo (JP); Kousuke Itou, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/899,744

(22) Filed: Jun. 12, 2020

(65) Prior Publication Data
US 2021/0156939 A1 May 27, 2021

(30) Foreign Application Priority Data
Nov. 21, 2019 (JP) .............................. JP2019-210420

(51) Int. Cl.
*G01R 33/50* (2006.01)
*G01R 33/567* (2006.01)
*G01R 33/54* (2006.01)
*G01R 33/44* (2006.01)

(52) U.S. Cl.
CPC ........... *G01R 33/50* (2013.01); *G01R 33/443* (2013.01); *G01R 33/546* (2013.01); *G01R 33/5676* (2013.01)

(58) Field of Classification Search
CPC .. G01R 33/50; G01R 33/5676; G01R 33/546; G01R 33/443
See application file for complete search history.

(56) References Cited

U.S. PATENT DOCUMENTS

| 4,694,250 A * | 9/1987 | Iwaoka | G06F 3/014 324/307 |
|---|---|---|---|
| 9,400,319 B2 | 7/2016 | Ito et al. | |
| 2011/0181285 A1 * | 7/2011 | Greiser | G01R 33/50 324/309 |

FOREIGN PATENT DOCUMENTS

WO  WO 2012/060192 A1  5/2012

OTHER PUBLICATIONS

D. R. Messroghli et al., "Modified Look-Locker Inversion Recovery (MOLLI) for High-Resolution T₁ Mapping of the Heart", Magnetic Resonance in Medicine 52: pp. 141-146 (2004).

* cited by examiner

*Primary Examiner* — G. M. A Hyder
(74) *Attorney, Agent, or Firm* — Baker Botts L.L.P.

(57) ABSTRACT

An object of the present invention is to provide an MRI apparatus capable of optimally setting imaging conditions for map measurement depending on a target value and its required accuracy, and a method for controlling the MRI apparatus. An imaging unit of the MRI apparatus includes, as a pulse sequence, a pulse sequence for the T1 map measurement that includes a first signal acquisition sequence and a plurality of signal acquisition sequences executed after application of an inverted pulse and at different signal acquisition times from the inverted pulse. An imaging controller of the MRI apparatus controls the imaging conditions of each of the plurality of signal acquisition sequences, for example, the signal acquisition time from the inverted pulse and the number of signal acquisition sequences depending on the T1 value of an imaging target and the required accuracy.

15 Claims, 18 Drawing Sheets

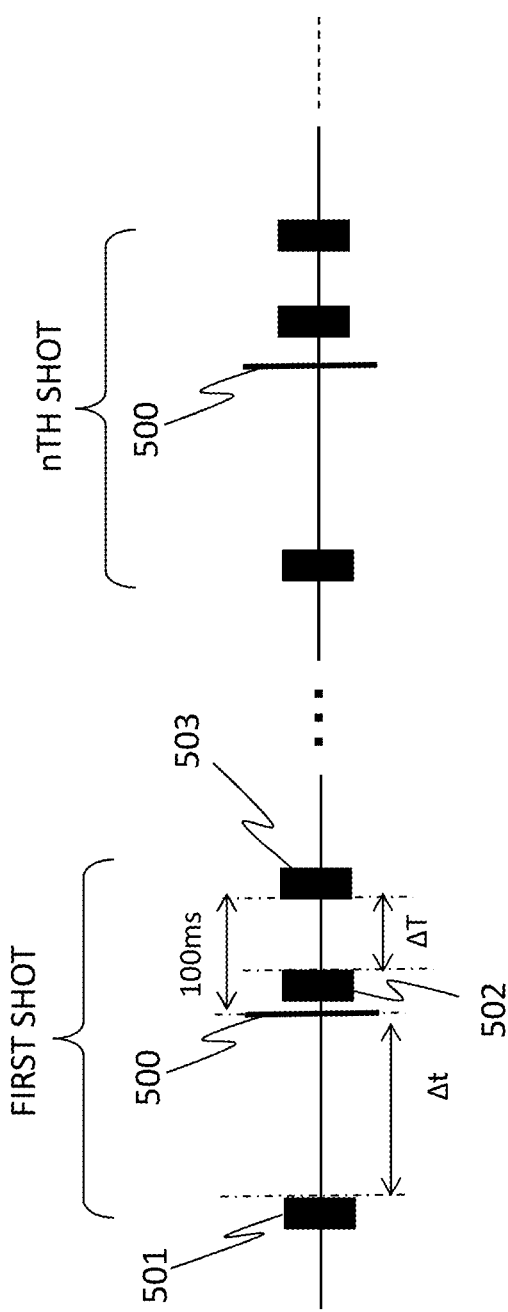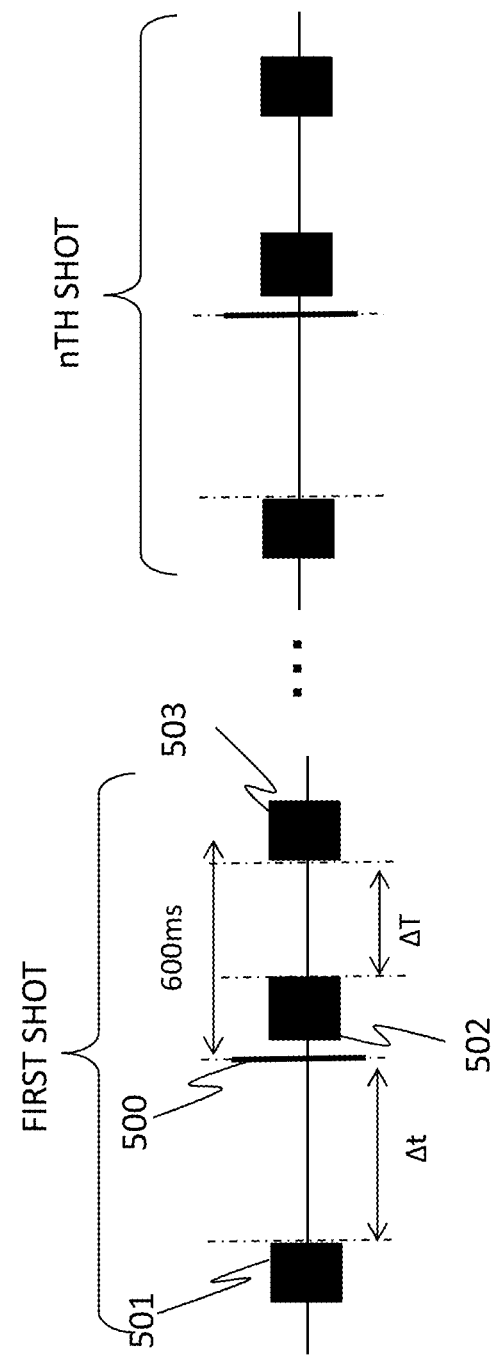

Fig. 10

| | INPUT | | OUTPUT | | | | | | | | |
|---|---|---|---|---|---|---|---|---|---|---|---|
| TARGET T1 VALUE (MINIMUM / MAXIMUM) | MEASUREMENT ACCURACY (%, AT MOST) | TI0 | TI1 | TI2 | TI3 | TI4 | TI5 | IMAGE TAKEN AT FIRST SHOT (TI) | IMAGE TAKEN AT SECOND SHOT (TI) | read out (ms) |
| 50 / 100 | 5 | -500 | 15 | 50 | 100 | - | - | 0, 3 | 2 | <30 |
| ... | ... | ... | ... | ... | ... | ... | ... | ... | ... | ... |
| 50 / 4000 | 5 | -500 | 15 | 100 | 1700 | 2500 | 3500 | 0, 1, 3, 5 | 2, 4 | <300 |
| 100 / 200 | 10 | -500 | 15 | 150 | - | - | - | 0, 1 | 2 | <500 |
| ... | ... | ... | ... | ... | ... | ... | ... | ... | ... | ... |
| 100 / 4000 | 10 | -500 | 15 | 100 | 1700 | 2500 | 3500 | 0, 1, 3, 5 | 2, 4 | <600 |
| 2000 / 2100 | 10 | -500 | 15 | 2000 | | | | 0, 1, 2 | - | <500 |
| ... | ... | ... | ... | ... | ... | ... | ... | ... | ... | ... |
| 2000 / 4000 | 10 | -500 | 15 | 2000 | 2500 | 3000 | 3500 | 0, 1, 2, 4 | 3, 5 | <300 |

Fig. 11

| INPUT | | | OUTPUT | | | | | | | |
|---|---|---|---|---|---|---|---|---|---|---|
| IMAGING TARGET | INSPECTION NAME | TI0 | TI1 | TI2 | TI3 | TI4 | TI5 | IMAGE TAKEN AT FIRST SHOT (TI) | IMAGE TAKEN AT SECOND SHOT (TI) | read out (ms) |
| HEAD | CONTRAST TEST | -500 | 15 | 150 | - | - | - | 0, 1 | 2 | <500 |
| ABDOMEN | LIVER FIBROSIS TEST | -500 | 15 | 100 | 1700 | 2500 | 3500 | 0, 1, 3, 5 | 2, 4 | <600 |
| CHEST | MYOCARDIAL FIBROSIS TEST | -500 | 15 | 100 | 1700 | 2500 | 3500 | 0, 1, 3, 5 | 2, 4 | <600 |
| . . . | | | | | | | | | | |

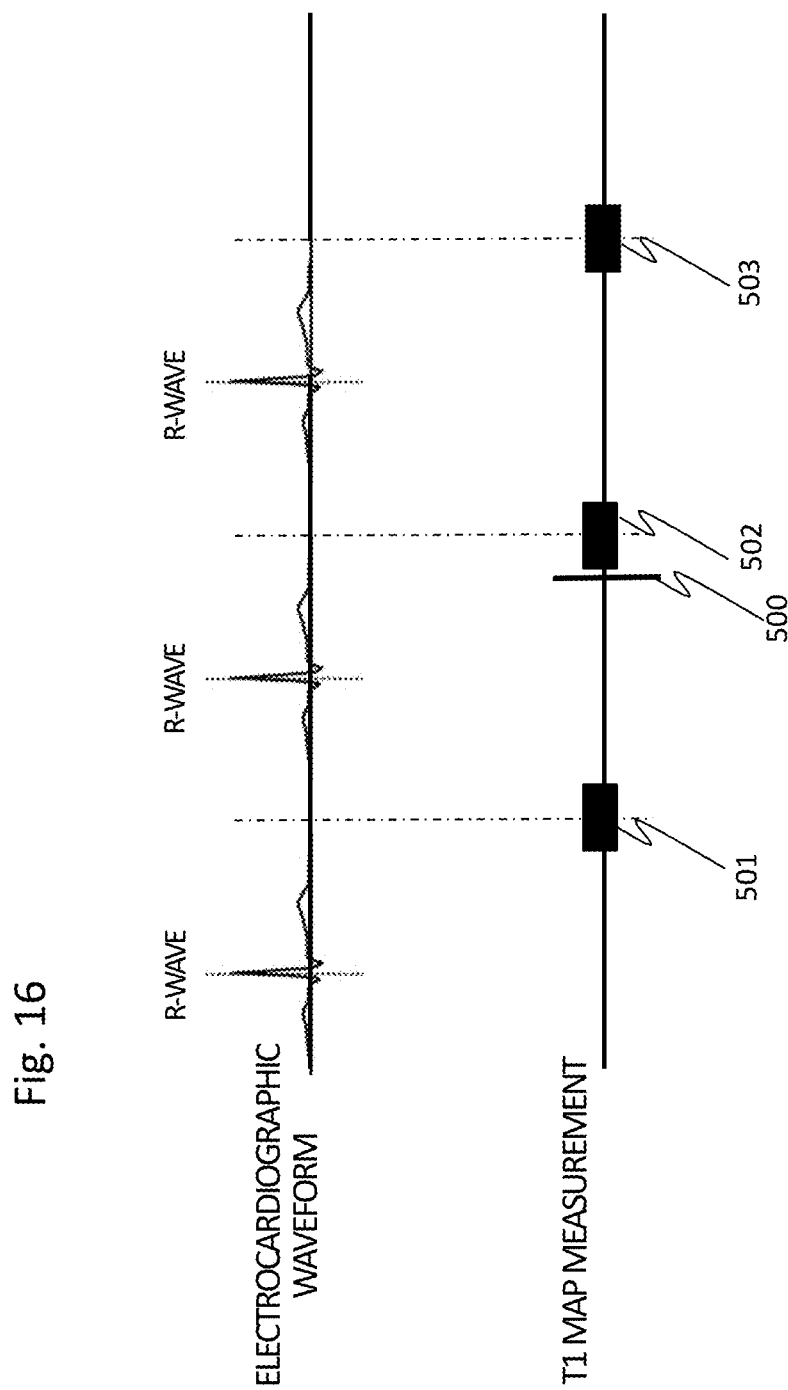

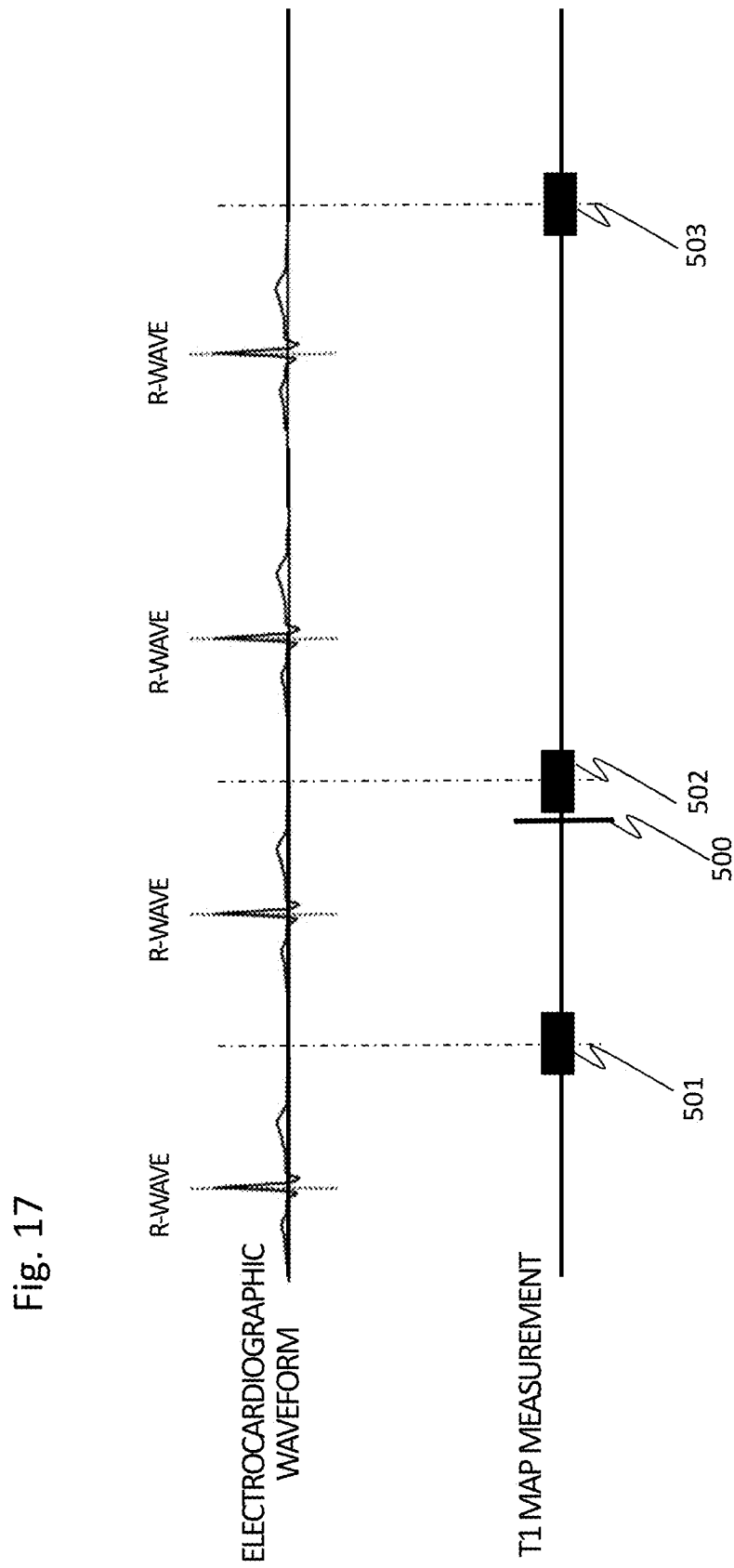

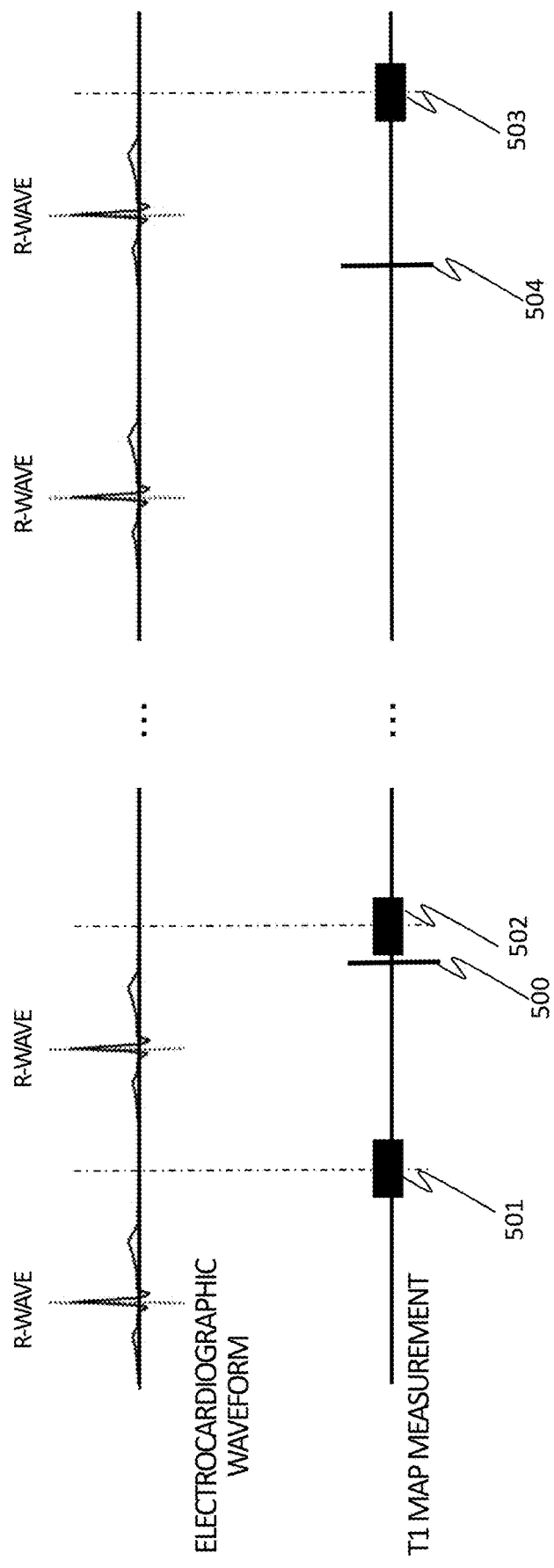

MAGNETIC RESONANCE IMAGING APPARATUS AND METHOD FOR CONTROLLING THE SAME

INCORPORATION BY REFERENCE

The present application claims priority from Japanese patent application JP-2019-210420 filed on Nov. 21, 2019, the content of which is hereby incorporated by reference into this application.

BACKGROUND OF THE INVENTION

Field of the Invention

The present invention relates to a magnetic resonance imaging (hereinafter, referred to as "MRI") apparatus, and particularly to T1 map measurement in the MRI apparatus.

Background Art

The MRI apparatus is an imaging apparatus for measuring nuclear magnetic resonance (NMR) signals generated by applying a high frequency magnetic field (RF) pulse to a subject in a state where the subject (particularly, a human body) is placed in a uniform static magnetic field, and for imaging the form or function of the subject's head, abdomen, extremities or the like two-dimensionally or three-dimensionally. Various images with different contrasts can be acquired by changing imaging conditions such as the timing of acquiring NMR signals, the type of an RF pulse, and the repetition time of application.

One of the images acquired by the MRI apparatus is a T1 map. The T1 map is an image acquired by directly calculating T1 from a T1 relaxation curve for each voxel and mapping the T1 value. Since the T1 value differs depending on tissue, a difference in the tissue and a change in property can be grasped from the T1 map, which is particularly useful for evaluation of myocardial properties.

Until now, various T1 map measurement methods have been proposed, but the Look-Locker method is currently most widely used clinically ("Modified Look-Locker Inversion Recovery (MOLLI) for High-Resolution T1 Mapping of the Heart", D. R. Messroghli et al., Magn. Reson. Med. 2004; 52: 141-146). In this method, a plurality of images are acquired at different timings in a longitudinal magnetization relaxation process after irradiating a pre-pulse for inverting spins, a longitudinal relaxation curve is obtained by fitting signal values of the images, and T1 is measured. In this method, it is necessary to acquire many images in order to stabilize fitting, and as a result, an error is large and it takes time.

On the other hand, PCT application No. 2011/073474 (WO2012/060192) proposes, as a method of measuring irradiation magnetic field distribution (B1 map) of the RF pulse, a method of performing a plurality of signal measurements at different timings after the pre-pulse irradiation, and describes that one of the signal measurements is performed before the pre-pulse irradiation. In addition, WO2012/060192 describes that the T1 value can also be calculated when the B1 map is calculated.

SUMMARY OF THE INVENTION

As described above, the conventional Look-Locker method described in "Modified Look-Locker Inversion Recovery (MOLLI) for High-Resolution T1 Mapping of the Heart", D. R. Messroghli et al., Magn. Reson. Med. 2004; 52: 141-146 has a problem that an imaging time is long and the error is large. The technique of WO2012/060192 is a technique for measuring the B1 map, and there is a description that the T1 map value can also be calculated, but the imaging conditions necessary for the T1 map measurement have not been studied. Therefore, it is difficult to calculate an accurate T1 value even if the T1 map is calculated from a signal acquired by a B1 map measurement pulse sequence described in WO2012/060192. In the T1 map measurement, since imaging parameters for improving accuracy and measurement time are different depending on the T1 value of an imaging target, it is expected that the imaging parameters are appropriately set each time, however, it is difficult to determine an appropriate parameter level, and an setting operation of the imaging parameters is also complicated.

An object of the present invention is to provide a technique capable of optimally setting the imaging conditions for the T1 map measurement depending on a target T1 value and its required accuracy.

In order to solve the above-described problems, the present invention provides an MRI apparatus including a unit that determines the imaging conditions depending on the target T1 value and the required accuracy, that is, what milliseconds can be identified and measured.

Specifically, the MRI apparatus of the present invention includes: an imaging unit that collects nuclear magnetic resonance signals; and an imaging controller that controls the imaging unit according to a predetermined pulse sequence. The pulse sequence includes a pulse sequence for the T1 map measurement that includes a first signal acquisition sequence and a plurality of signal acquisition sequences executed after application of an inverted pulse and at different signal acquisition times from the inverted pulse, and the imaging controller controls the imaging conditions of each of the plurality of signal acquisition sequences depending on a T1 value of an imaging target and the required accuracy. Although various values can be considered for the T1 value depending on a region and tissue, "the T1 value of the imaging target" means the T1 value of a target (such as a human tissue or a phantom) of the T1 map measurement, and when there is a range in the T1 value, it means the value including a range of the value.

Further, the MRI apparatus of the present invention is a magnetic resonance imaging apparatus including: an imaging unit that collects nuclear magnetic resonance signals; and an imaging controller that controls the imaging unit according to a predetermined pulse sequence. The pulse sequence includes a pulse sequence for the T1 map measurement that includes a first signal acquisition sequence and a plurality of signal acquisition sequences executed after application of an inverted pulse and at different signal acquisition times from the inverted pulse. The pulse sequence for the T1 map measurement includes a second and third signal acquisition sequences executed after application of a first inverted pulse and at different signal acquisition times from the first inverted pulse, and a fourth and fifth signal acquisition sequences executed after application of a second inverted pulse and at different signal acquisition times from the second inverted pulse. The signal acquisition times of the fourth and fifth signal acquisition sequences are respectively different from the signal acquisition times of the second and third signal acquisition sequences.

A method for controlling the magnetic resonance imaging apparatus according to the present invention is a method for controlling the magnetic resonance imaging apparatus that executes a pulse sequence for the T1 map measurement that includes a first signal acquisition sequence and a plurality of signal acquisition sequences executed after application of an inverted pulse and at different signal acquisition times from the inverted pulse, and includes: a step of receiving information on a T1 value of an imaging target and the required accuracy; and a step of determining the pulse sequence for the T1 map measurement based on a relationship between information on a previously stored T1 value and its accuracy and imaging conditions of the pulse sequence for the T1 map measurement. The imaging conditions include any one of the signal acquisition time from the inverted pulse, the signal acquisition time, and the number of signal acquisition sequences, of each of the plurality of signal acquisition sequences.

According to the MRI apparatus of the present invention, it is possible to execute a sequence (first signal acquisition sequence) for acquiring an image not affected by the pre-pulse in the T1 map measurement, and to optimize the number of signal acquisition sequences after the pre-pulse and an interval between the signal acquisition sequences for the T1 map measurement by using the signal values of the image for calculating the T1 map, so that the accuracy of the calculated T1 value can be improved and the measurement time can be shortened. In particular, it is possible to set parameters according to the T1 value of the imaging target, its range, and the required accuracy, and realize high T1 map accuracy in a wide range of T1 value.

BRIEF DESCRIPTION OF THE DRAWINGS

FIGS. 7A and 7B are diagrams illustrating examples of an imaging sequence of a first embodiment;

FIG. 10 is a diagram illustrating an example of a table stored in a storage device;

FIG. 11 is a diagram illustrating another example of the table stored in the storage device;

FIG. 16 is a diagram illustrating an example of the imaging sequence of the third embodiment;

FIG. 17 is a diagram illustrating an example of the imaging sequence of the third embodiment; and FIG. 18 is a diagram illustrating an example of the imaging sequence of the third embodiment.

DETAILED DESCRIPTION OF THE INVENTION

Hereinafter, embodiments of an MRI apparatus of the present invention will be described with reference to the drawings.

Figure 1:
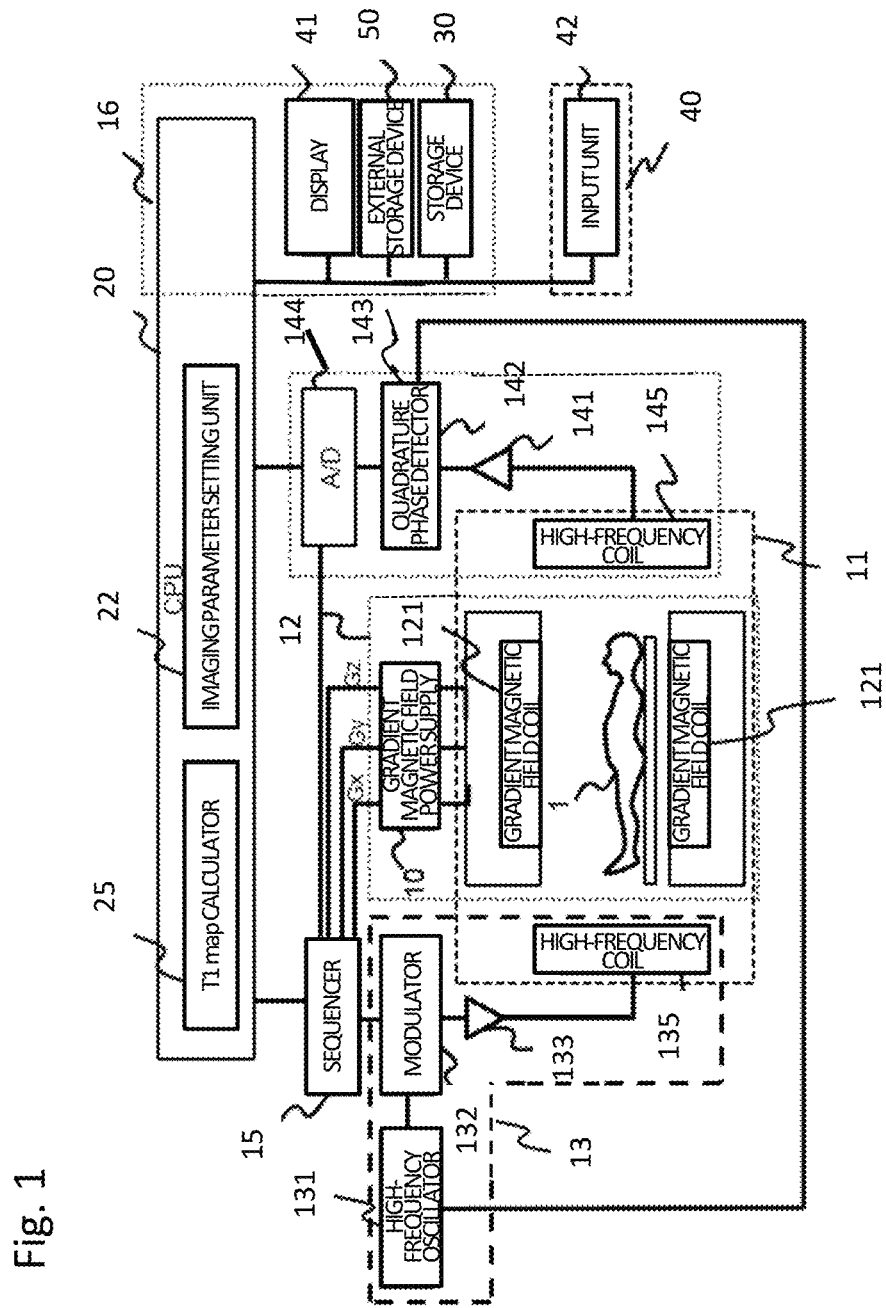
FIG. 1 is a diagram illustrating an overall configuration of an MRI apparatus to which the present invention is applied.

First, an overall configuration of the MRI apparatus to which the present invention is applied will be described. As illustrated in FIG. 1, the MRI apparatus includes a static magnetic field generator 11, a gradient magnetic field generator 12, a transmitter 13, a receiver 14, a sequencer 15, a signal processor 16, and a computer (CPU) 20. The above units other than the computer 20 are collectively referred to as an imaging unit 10.

The static magnetic field generator 11 includes a permanent magnet type, normal conduction type or superconducting type static magnetic field generation source, and generates a uniform static magnetic field in a space where the subject 1 is placed. Depending on a direction of the generated static magnetic field, there are a vertical magnetic field type and a horizontal magnetic field type.

The gradient magnetic field generator 12 includes gradient magnetic field coils 121 that apply gradient magnetic fields in three axis directions of X, Y, and Z that are a coordinate system (stationary coordinate system) of the MRI apparatus, and gradient magnetic field power supplies 123 that respectively drive gradient magnetic field coils 121. The gradient magnetic fields Gx, Gy, and Gz are applied in three axis directions of X, Y, and Z by driving the gradient magnetic field power supplies 123 of the respective coils in accordance with a command from a sequencer 15 described below. By combining the gradient magnetic fields, it is possible to generate a gradient magnetic field in an arbitrary direction. An arbitrary imaging cross-section (slice) is selected, a gradient magnetic field is applied in a phase encoding direction and a frequency encoding direction which are orthogonal to the imaging cross-section and orthogonal to each other, and position information in each direction is encoded in an NMR signal.

The transmitter 13 irradiates the subject 1 with an RF pulse in order to cause nuclear magnetic resonance of nuclear spins of atoms constituting a living tissue of the subject 1, and includes a high-frequency oscillator 131, a modulator 132, a high-frequency amplifier 133, and a high-frequency coil (transmission coil) 135 on a transmission side. The RF pulse output from the high-frequency oscillator 131 is amplitude-modulated by the modulator 132 at a timing according to the command from the sequencer 15, and the amplitude-modulated high-frequency pulse is amplified by the high-frequency amplifier 133 and then supplied to the high-frequency coil 135 disposed close to the subject 1, so that the subject 1 is irradiated with the RF pulse.

The receiver 14 detects the NMR signal emitted by nuclear magnetic resonance of nuclear spins constituting the living tissue of the subject 1, and includes a high-frequency coil (receiving coil) 145 on a receiving side, a signal amplifier 141, a quadrature phase detector 142, and an A/D converter 143. The NMR signal that is a response of the subject 1 induced by the RF pulse irradiated from the high-frequency coil 135 on the transmission side is detected by the high-frequency coil 145 disposed close to the subject 1 and amplified by the signal amplifier 141. Thereafter, the NMR signal is divided into two orthogonal signals by the quadrature phase detector 142 at the timing according to the command from the sequencer 15, and each signal is converted into a digital quantity by an A/D converter 143 and transmitted to the signal processor 16 as measurement data.

The sequencer 15 operates under control of the computer and transmits various commands necessary for data collection of tomographic images of the subject 1 to the transmitter 13, the gradient magnetic field generator 12, and the receiver 14, and controls to repeatedly apply a high-frequency magnetic field pulse (hereinafter, referred to as "RF pulse") and a gradient magnetic field pulse in a predetermined pulse sequence.

The signal processor 16 performs various data processing, display and storage of processing results, and the like, and the CPU 20 can also perform a part or all of its functions.

The computer 20 includes a storage device 30 such as a RAM and a ROM, a UI unit 40 including a display 41 and an operation device 42, and an external storage device 50 such as a magnetic disk and an optical disk. The UI unit 40 receives imaging conditions or a command such as an imaging start from a user, and displays a UI screen prompting the command, or an imaging result on the display 41, to realize interactive communication with the user.

The computer 20 functions as a controller that controls an entire MRI apparatus, functions as a calculator that receives data from the receiver 14 and performs processing such as signal processing and image reconstruction, displays the tomographic image of the subject 1 that is a result of various calculation on the display 41, and records it in the storage device 30 or the external storage device 50.

Figure 2:
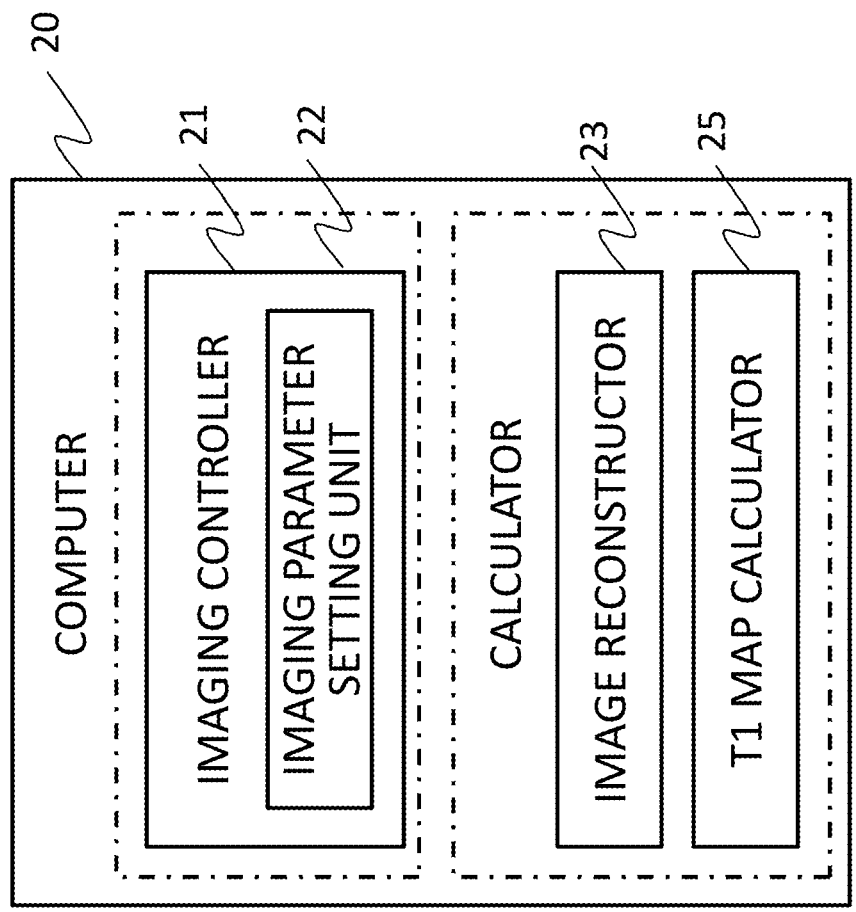
FIG. 2 is a functional block diagram of a computer (CPU)

FIG. 2 illustrates a functional block diagram of the computer 20 functioning as a controller and the calculator. As illustrated, the computer 20 includes an imaging controller that controls imaging according to information and conditions necessary for imaging, which is input through the UI unit 40, an imaging parameter setting unit 22 that sets imaging parameters, an image reconstructor 23 that generates the image using the signal processed by the signal processor 16, and a T1 map calculator 25 that calculates a T1 map by calculation using the image. Note that the computer 20 may include a functional unit included in a general MRI apparatus, which is not illustrated in FIG. 2.

The imaging conditions received by the imaging controller 21 include a region of the imaging target, an imaging sequence, and parameters for determining the imaging sequence, for example, a bandwidth of the high-frequency magnetic field, TE, TR, the number of slice encodes, the number of phase encodes, and an imaging range (FOV). There are various pulse sequences in the imaging sequence depending on an imaging method, which are stored in the storage device in advance. The imaging controller 21 reads a predetermined imaging sequence according to the imaging target or an imaging purpose, and performs imaging by executing the imaging sequence with the imaging parameters set in the imaging parameter setting unit 22. In the present embodiment, the pulse sequence for T1 map measurement is performed as the imaging sequence.

The imaging parameters of the pulse sequence for the T1 map measurement include, in addition to the general imaging parameters described above, a TI time, the number of signal acquisition sequences (the number of acquired images), an interval between the signal acquisition sequences, and a signal acquisition time in the signal acquisition sequence (or the number of shots of a pre-pulse), an interval between the signal acquisition sequence and the pre-pulse, and the like. The imaging parameters may be set in advance in the imaging parameter setting unit 22 with predetermined parameters as defaults, or may be set based on user specification through the UI unit 40. The user specification is, for example, the T1 value of the imaging target or the required accuracy of the T1 map (how many milliseconds the user wants to determine a difference), and an input format may be various. Details of imaging parameter setting for the T1 map measurement will be described below.

The T1 map calculator 25 obtains the T1 map based on the NMR signal detected by the receiver 14 in T1 map imaging. A calculation method of the T1 map is achieved by changing the calculation method according to the set parameter (the number of acquired images).

The above-described functions such as control and calculation of the computer 20 are realized as software by the CPU of the computer 20 reading and executing a program stored in the storage device 30 or the storage device 50. Regarding the T1 map calculation, a branch of a T1 calculation method according to the set number of acquired images is stored in the storage device 30, and the T1 map calculator 25 calculates the T1 map based on this. However, one of calculation functions may be realized by hardware such as an ASIC or an FPGA.

Figure 3:
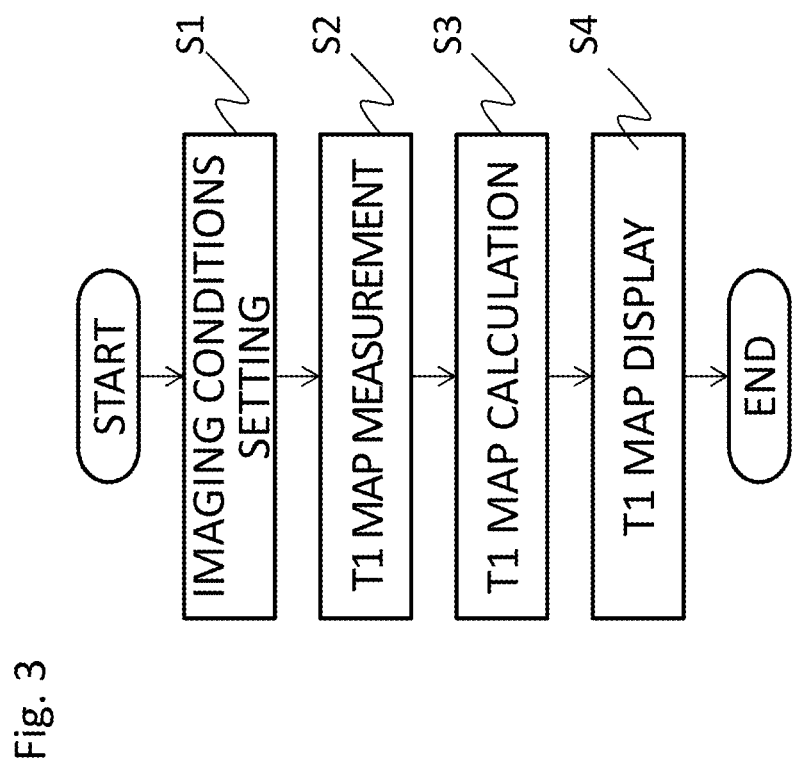
FIG. 3 is a diagram illustrating a procedure of T1 map measurement.

Next, an outline of T1 map measurement by the MRI apparatus of the present embodiment will be described. FIG. 3 illustrates a processing flow.

First, the imaging controller 21 sends the command to the sequencer 15 based on a preset imaging sequence, the imaging parameters, and the imaging conditions, and starts imaging by the imaging unit 10 (S1). At this time, the imaging controller 21 sets appropriate imaging parameters according to the T1 value of the imaging target, the accuracy (definition) of the T1 map desired by the user, and the like.

The imaging unit 10 determines an imaging position of the subject by performing known positioning imaging or the like, and then executes the imaging sequence for T1 map measurement with the set imaging parameters (S2). In the imaging sequence for the T1 map measurement, a sequence (signal acquisition sequence) for acquiring a plurality of images having different signal acquisition times from application of the pre-pulse is executed in the longitudinal magnetization relaxation process using a pulse for inverting longitudinal magnetization as a pre-pulse. However, in the present embodiment, the signal acquisition sequence is executed prior to the application of the pre-pulse, and the TI time and the like of the signal acquisition sequence executed after the pre-pulse are adjusted by the set imaging parameter.

By using the image acquired in the signal acquisition sequence executed before the application of the pre-pulse for the T1 map calculation, the number of signal acquisition sequences after the application of the pre-pulse can be reduced and the accuracy of the T1 map calculation can be improved.

Figure 4:
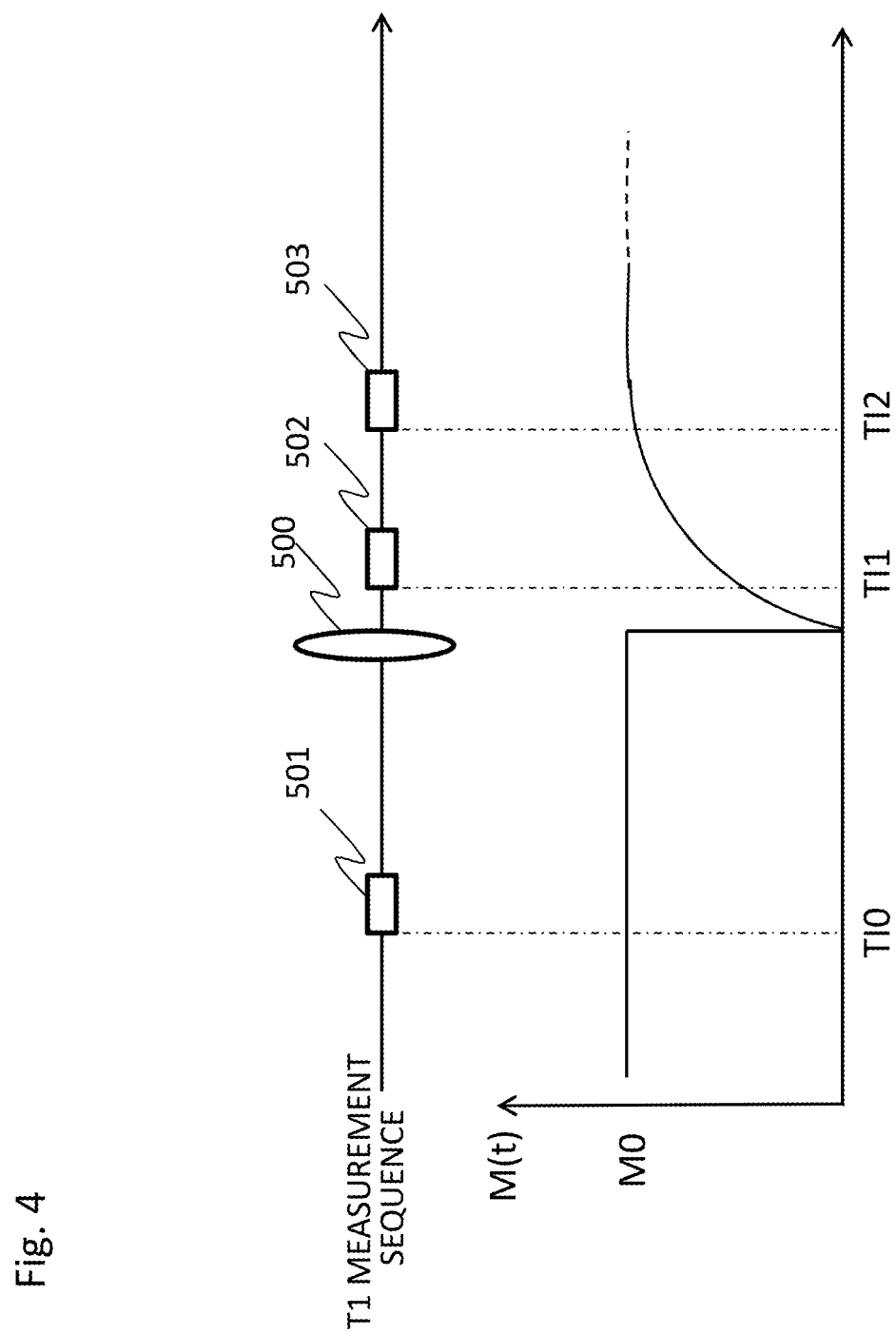
FIG. 4 is a diagram illustrating an outline of an example of a pulse sequence for the T1 map measurement.
Figure 5:
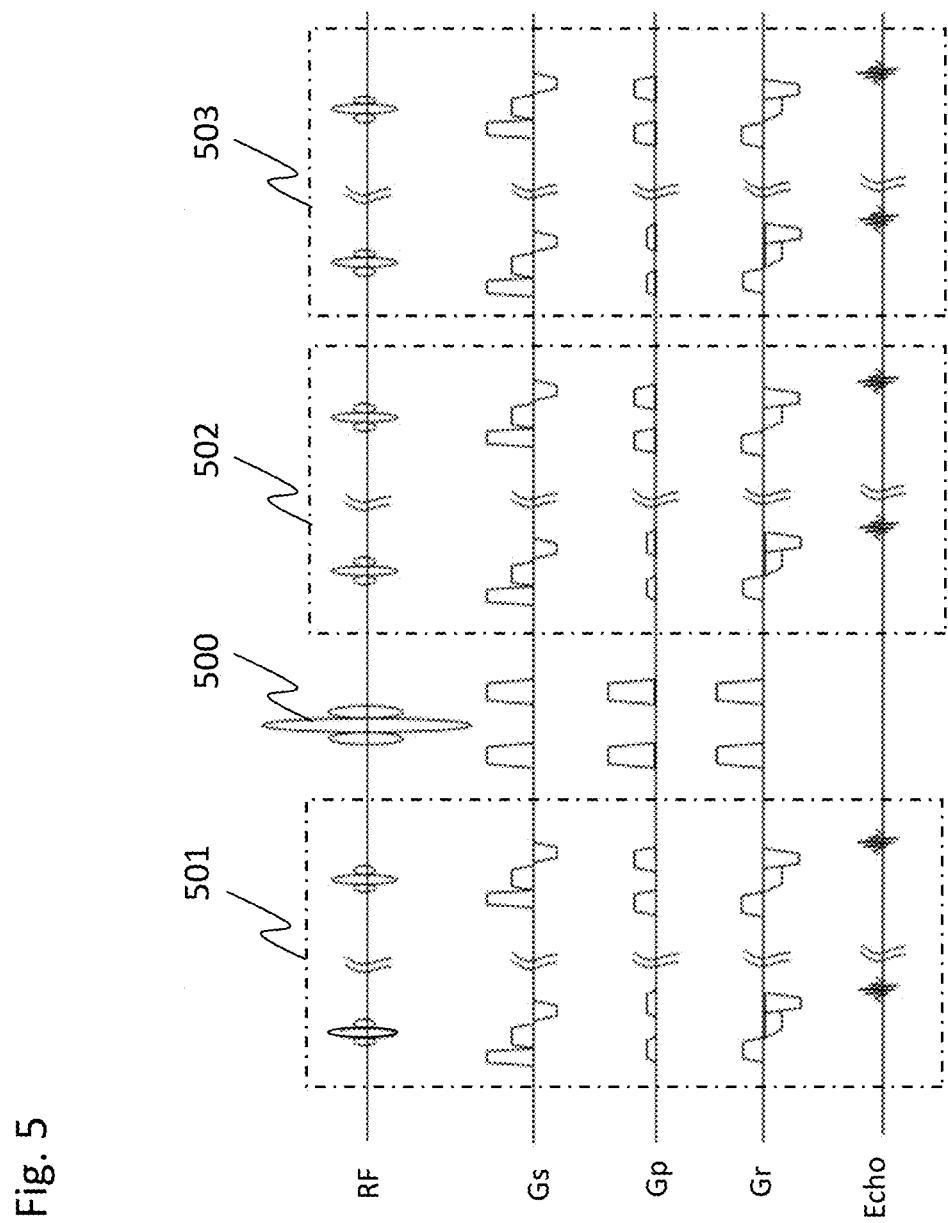
FIG. 5 is a diagram illustrating details of the pulse sequence for the T1 map measurement of FIG. 4.

FIGS. 4 and 5 illustrates an example of the imaging sequence of the present embodiment. FIG. 4 is a diagram illustrating an outline of the pulse sequence for the T1 map measurement and a change in longitudinal magnetization, and FIG. 5 is a diagram illustrating details of the pulse sequence.

As illustrated in FIG. 4, in the T1 map measurement of the present embodiment, first, an imaging sequence (signal acquisition sequence) 501 for acquiring the image is executed, and then a pre-pulse 500 is applied, and second and third signal acquisition sequences 502 and 503 are executed after a predetermined time (TI time) from the application. As illustrated in a lower portion of FIG. 4, the pre-pulse 500 is a 180-degree RF pulse (an IR pulse) in which longitudinal magnetization M0 (nuclear spin) is reversed. The signal acquisition sequences 502 and 503 are executed at different TI times in the relaxation process in longitudinal time. FIG. 4 illustrates a case where the signal acquisition sequence is executed twice after the application of the pre-pulse, but is not limited to twice.

The signal acquisition sequences 501 to 503 are pulse sequences GE of the same gradient echo system. As illustrated in FIG. 5, an excitation RF pulse is applied together with a predetermined slice selection gradient magnetic field, and then a phase encoding gradient magnetic field pulse and a readout gradient magnetic field pulse are applied and a gradient echo is measured. The process from the application of the RF pulse to the measurement of the echo is repeated while changing an intensity of the phase encoding gradient magnetic field pulse, to collect signals used for the image reconstruction. The number of RF pulse irradiations in each of the signal acquisition sequences 501 to 503 is the same as the number of matrices in the T1 map. In the T1 map measurement, a low-resolution image may be acquired, and for example, the number of matrices is 64×64.

In the first signal acquisition sequence 501, the signals not affected by the pre-pulse 500 are collected. The image acquired in the signal acquisition sequence 501 is referred to herein as a reference image or a TI0 image. The images acquired in the signal acquisition sequences 502 and 503 executed after the application of the pre-pulse 500 are referred to herein as a TI1 image and a TI2 image. The signal acquisition requires a predetermined time until a predetermined number of echoes are measured, and for example, the time at which the echo placed at a center of k-space data is measured is defined as the signal acquisition time. In a centric order sequence in which the measurement of the echo signal is started from a center of k-space, a signal acquisition start time is the signal acquisition time.

The image reconstructor 23 reconstructs the image using the signals acquired in the signal acquisition sequences 502 and 503 executed in the longitudinal magnetization relaxation process and in the signal acquisition sequence 501 not affected by the pre-pulse. The T1 map calculator 25 calculates T1 for each pixel by performing a calculation between the images, to create the T1 map (S3).

Assuming that signal values (signal values of each pixel) of the three images of the reference image, the TI1 image, and the TI2 image acquired in the three signal acquisition sequences 501 to 503 of the above-described T1 map measurement are respectively S(TI0), S(TI1), and S(TI2), they can be represented by the following equations (1-1) to (1-3).

$$S(TI0) \propto M0 \quad (1\text{-}1)$$

$$S(TI1) \propto M0[1-(1-\cos(FA)e\text{-}TI1/T1)] \quad (1\text{-}2)$$

$$S(TI2) \propto M0[1-(1-\cos(FA)e\text{-}TI2/T1)] \quad (1\text{-}3)$$

In the equation, M0 is magnitude of the longitudinal magnetization, and FA is irradiation magnetic field intensity (B1).

Based on the signal values of the three images, the T1 value is obtained by solving a simultaneous equation of longitudinal relaxation.

When the signal acquisition sequence after applying the pre-pulse is set to three or more times, for example, from a set of three images such as [TI0, TI1, TI2], [TI0, TI1, TI3], [TI0, TI1, TI4], T1 is obtained by solving the simultaneous equation of longitudinal relaxation based on the signal values of the three images. Since T1s respectively close to TI2, TI3, and TI4 are accurately obtained for the three results, the T1 map is obtained by finally adopting an accurate result out of two results for each range of T1. Note that the number of acquired images is not limited to up to TI4, but may be up to TI3, or may be up to TI5 or more.

The above-described algorithm for calculating the T1 map is branched and stored in the storage device 30 depending on the number of acquired images, and when the number of acquired images is determined, the T1 map calculator 25 calculates the T1 map by the calculation method corresponding thereto.

The T1 map is obtained by calculating T1 for each pixel. The calculation result of the T1 value and the T1 map are displayed on the display in a predetermined display form (S4).

In the above-described T1 map measurement, the imaging controller (imaging parameter setting unit) 21 adjusts the imaging parameter for improving the accuracy of calculation of the T1 value. The imaging parameters adjusted by the imaging controller 21 include, in addition to the TI times of the signal acquisition sequence 502 and 503 after the pre-pulse 500, at least one of the interval between the signal acquisition sequences 502 and 503, the number of signal acquisition sequences (the number of acquired images), and the number of shots (the number of pre-pulses).

Hereinafter, adjustment of the imaging parameters for the T1 map measurement set in the imaging parameter setting unit 22 will be described in detail.

The calculation for calculating T1 by the T1 map calculator 25 is a process of fitting the longitudinal relaxation curve illustrated in FIG. 4. When performing the calculation using the image acquired in the imaging sequence of FIG. 4, the accuracy of solution obtained by the fitting follows the following principles (1) to (4).

Figure 6:
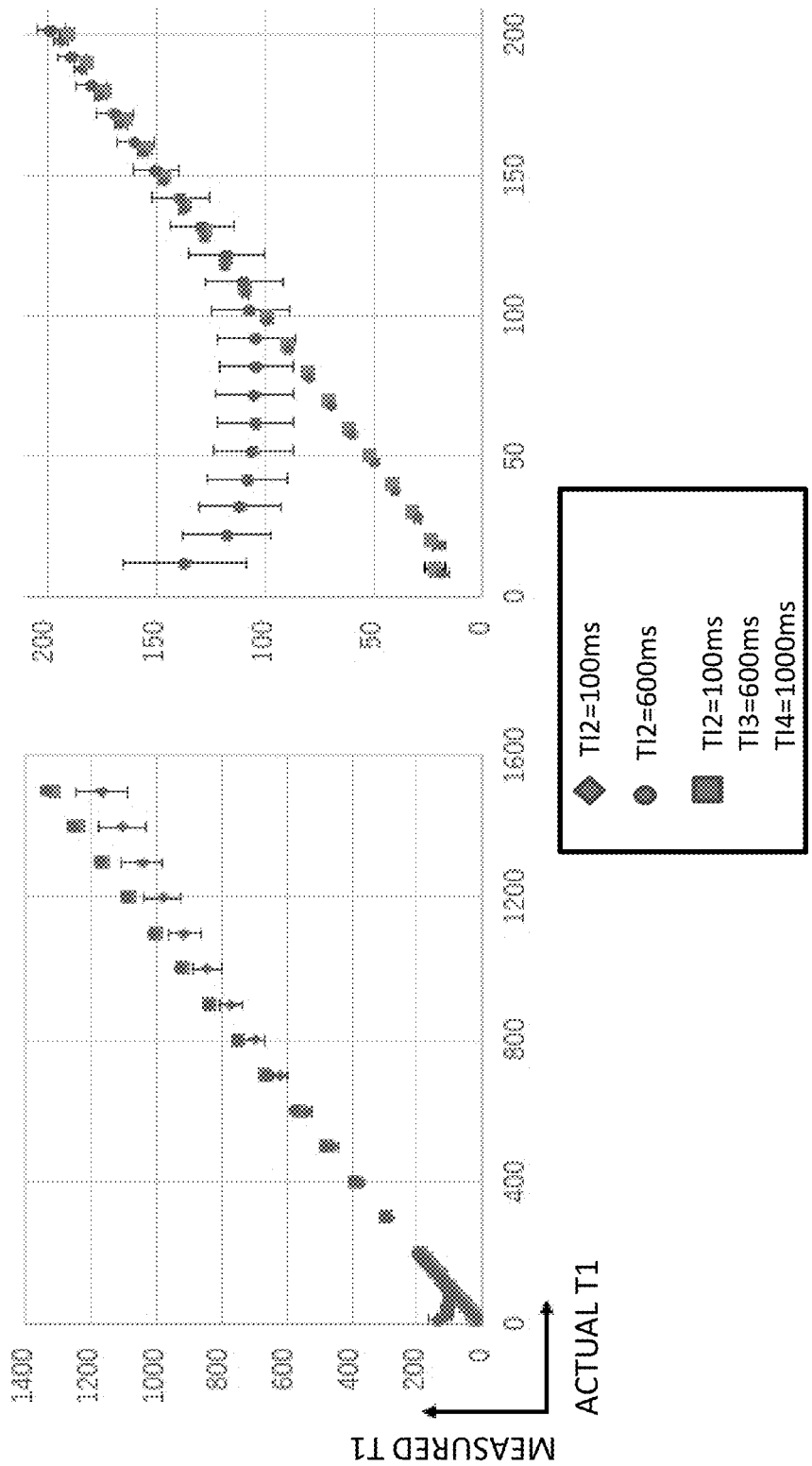
FIG. 6 is a view illustrating a difference between an actual T1 and a calculated value depending on a set TI.

(1) The solution is more accurate as a flip angle (FA) applied during pre-pulse irradiation approaches 180 degrees. (2) The fitting is more stable as the interval between a second signal acquisition time and a third signal acquisition time is longer. (3) More accurate solution is obtained as the TI time of the signal acquisition sequence is closer to the T1 value. For example, FIG. 6 is a diagram illustrating the relationship between the actual T1 value and the calculated T1 value when the TI (TI2) of the third signal acquisition sequence is changed. In the figure, the left side is a diagram in which a scale on the right side is reduced. As illustrated, for example, if TI2=100 ms, the true TI2=100 ms can be measured as 100 ms, however, the true TI2=600 ms is calculated with an error such as 500 ms. If TI2=600 ms, true TI2=600 ms can be measured as 600 ms, however, the true TI2=50 ms is calculated with the error such as 100 ms (FIG. 6).

In the figure, the dot "■" indicates a case where the number of signal acquisition sequences (the number of acquired images) is four, and in this case, the fitting is good in a wide range of T1 values. That is, (4) a wide range of T1 values can be accurately obtained by increasing the number of acquired images. However, if the number of acquired image during one longitudinal relaxation is large, the interval between the signal acquisition sequences cannot be ensured, resulting in a large error. Therefore, when increasing the number of acquired image, it is necessary to adjust the number of pre-pulse shots in order to secure the interval between the signal acquisition sequences.

The imaging parameter setting unit 22 sets the imaging parameters according to these principles so as to increase the accuracy of the fitting and to minimize the imaging time.

Specifically, Regarding (1), the flip angle of the pre-pulse 500 is set in consideration of the flip angle of the excitation RF pulse applied in the signal acquisition sequence 501. For example, the interval (Δt) between the signal acquisition sequence 501 and the pre-pulse 500 is not particularly limited, and is set as close as possible, so that a total of the FAs of the RF pulse of the signal acquisition sequence 501 and the pre-pulse 500 is set to be 180 degrees.

Regarding the interval of the signal acquisition sequence of (2), a time difference (ΔT) between TI1 and TI2 can be increased by setting the TI of the signal acquisition sequence 502 that is executed first after the pre-pulse to a minimum value that can be set.

Regarding (3), the TI time (TI2) of the signal acquisition sequence 503 is set according to the T1 value of the target tissue. When accurately measuring from short T1 to long T1, the number of images to be acquired is increased (add TI3, TI4 - - - ). In this case, the number of shots is adjusted in order to ensure the interval between the signal acquisition sequences (the interval between the image acquisitions). Adjustment of the number of shots is to acquire the signal to be acquired in the signal acquisition sequence in a plurality of times, so that the signal acquisition time can be reduced and the interval between the image acquisitions can be increased.

As described above, in the MRI apparatus (the imaging controller) of the present embodiment, the imaging parameters of the pulse sequence for T1 map measurement are adjusted depending on the tissue that is the imaging target, the accuracy and the imaging time requested by the user. This improves the accuracy of T1 value measurement without increasing the imaging time.

Hereinafter, a specific embodiment of the adjustment by the imaging controller will be described.

First Embodiment

In the present embodiment, a specific setting example set by the imaging parameter setting unit 22 will be described.

The imaging parameter setting unit 22 receives the user specification regarding the target T1 value and the required accuracy, and sets the imaging parameters.

When the user-specified T1 value is a single value, as illustrated in FIGS. 7A and 7B, the imaging sequence in which two signal acquisition sequences are executed after the application of the pre-pulse is set, and in the first signal acquisition sequence 502 after the pre-pulse, TI1 is set to, for example, 10 ms to keep an interval from the pre-pulse as small as possible. The second signal acquisition sequence 503 sets TI2 according to the specified T1 value.

The number of shots is changed depending on the required accuracy in order to increase the interval between image acquisitions. For example, when the number of matrices of the T1 map is 64×64 and TR=5 ms, the acquisition time of each image is 5 ms×64=320 ms. At this time, for example, when TI1=10 ms and TI2=600 ms, the interval between each image acquisition is 270 ms (=600−(10+320)).

On the other hand, when the number of shots is 2, since the image acquisition time can be reduced to half (5 ms×32=160 ms), the interval between the image acquisitions can be increased to 430 ms (=600−(10+160)). Thus, for example, when the interval between the image acquisitions is 270 s and when the true T1 value (600 ms) is calculated as 550 ms, the accuracy can be improved such that it is calculated as 590 ms.

When the tissue to be measured includes a plurality of T1 values and has a relatively wide range, the number of acquired images, that is, the number of signal acquisition sequences after the application of the pre-pulse is increased. In this case, three or more signal acquisition sequences may be executed after one application of the pre-pulse, however, the error increases as the number of image acquisitions during one longitudinal relaxation increases. Therefore, in this case, the number of shots is increased, and the TI of the signal acquisition sequence executed after the application of the pre-pulse is made different between adjacent shots.

Figure 8:
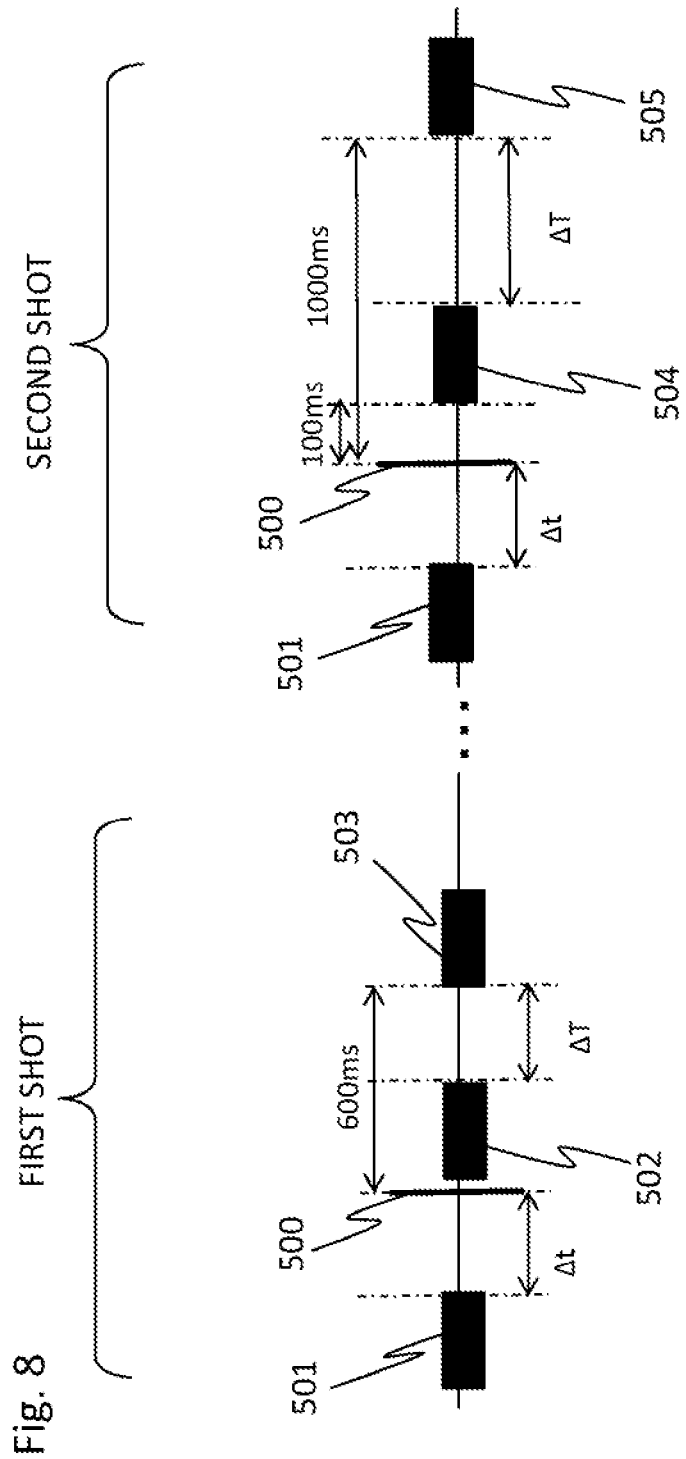
FIG. 8 is a diagram illustrating another example of the imaging sequence of the first embodiment.

For example, as illustrated in FIG. 8, the TI1 image and a TI3 image (TI=600 ms) are acquired at the first shot, and the TI2 image (TI=100 ms) and a TI4 image (TI=1000 ms) are acquired at the second shot. Thus, the interval (ΔT) between the image acquisitions can be increased, and the accuracy of the calculated T1 value is improved. The TI0 image may be acquired before any one pre-pulse, however, in order to make the application conditions (flip angles) of the pre-pulse uniform, it is preferable to execute the TI0 signal acquisition sequence in any shot.

When the number of signal acquisition sequences after the application of the pre-pulse is increased, the T1 map calculator 25 selects the calculation method depending on the number of images from the storage device 30, to calculate the T1 map. That is, as described above, T1 is obtained by using a plurality of sets of three images, and the most accurate result is finally adopted for each range of T1 to form a T1 map.

The above-described adjustment of the imaging parameters may be performed according to the T1 value, or the range thereof, and the required accuracy specified by the user, or a predetermined value may be set by default. When the imaging parameters are specified by the user, degree of freedom of the user regarding the accuracy and the measurement time is increased. On the other hand, when the imaging parameters are set by default, the imaging parameters do not change every time, so that there is an advantage that the imaging is simplified. However, the values set by default may be adjustable by the user. Hereinafter, specific examples in each case will be described.

[User Specification]

Figure 9B:
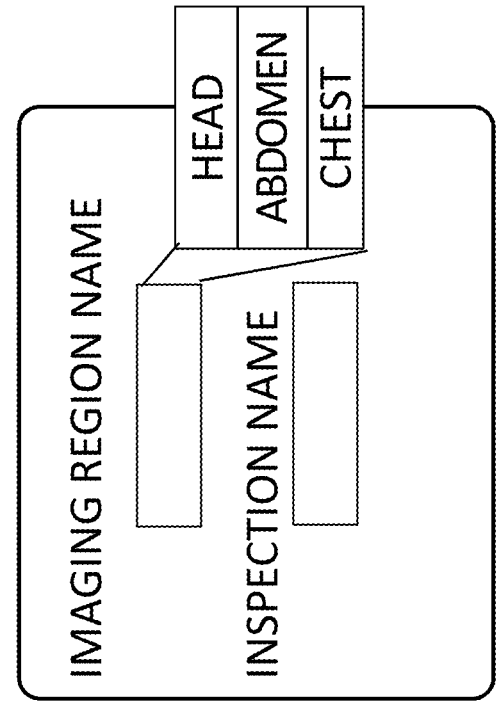
FIGS. 9A and 9B are diagrams illustrating examples of a display screen of a UI unit.
Figure 9A:
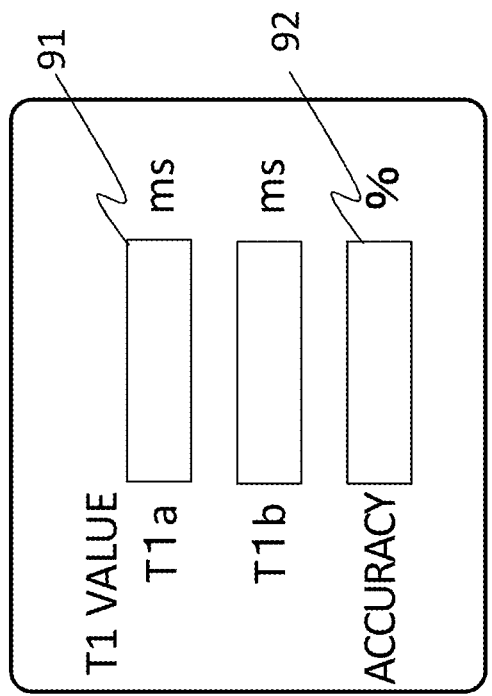

The user specification may be another expression that can specify the T1 value and the required accuracy, such as inputting the T1 value and the required accuracy themself. FIGS. 9A and 9B illustrate examples of the UI screen for receiving the user specification. FIG. 9A is a screen provided with input boxes 91 and 92 for inputting the T1 value and the required accuracy. The user can input one or a plurality of T1 values in the input box 91 prior to the T1 map measurement, and input a numerical value for accuracy in the input box 92, or select and specify "low", "medium", or "high". Instead of the accuracy, or in addition to the accuracy input box, an input box such as the measurement time "short", "medium", or "long" may be added. FIG. 9B is an example of the UI screen that receives input of the imaging target (region name) and an inspection name. Any of them may be input in a text format or may be a pull-down menu. In the case of FIG. 9B, the user can further reduce difficulty of operation as compared with the case of FIG. 9A.

A table indicating the relationship between the user specification and the imaging parameters is stored in the storage device 30 in advance. The stored table records a method of determining the optimum imaging parameters obtained in advance by simulation.

FIG. 10 illustrates an example of the table when the user specification is as in FIG. 9A, and FIG. 11 illustrates an example of the table when the user specification is as in FIG. 9B. When the input in text format is received on the input screen of FIG. 9B, a table is previously created in which received words are associated with registered imaging target names or inspection names. Upon receiving the user specification input through the UI screen, the imaging parameter setting unit 22 determines the appropriate number of acquired images, the TI value, the number of shots, and the timing of acquiring each image based on the table.

For the determined imaging conditions, the imaging time may be calculated and displayed. Thus, if this does not meet a desired imaging time, the user may re-enter the required accuracy or adjust the parameters manually as appropriate, to perform imaging. The imaging controller 21 controls imaging by the imaging unit 10 using the finally set imaging conditions and other imaging parameters.

By setting the imaging conditions based on the user specification, the apparatus automatically selects the optimal imaging parameters of the T1 map, so that an imaging person does not need to adjust the imaging parameters based on the principles each time, and the difficulty and complexity of setting operation can be eliminated.

[Default Setting]

On the other hand, when the imaging parameters are set by default instead of being specified by the user, since the T1 value of human tissue and its range are determined to some extent, the imaging sequence targeting two or more T1 values covering the range is set in advance. For example, as a default, the imaging sequence for measuring the T1 values of four points (for example, TI1=10 ms, TI2=100 ms, TI3=600 ms, TI3=1000 ms) with two shots is set as illustrated in FIG. 8. Further, for the method of calculating T1, the calculation method is also set in which T1 is obtained based on the signal values of three images respectively from the set of three images such as [TI0, TI1, TI2], [TI0, TI1, TI3], and [TI0, TI1, TI4] and an accurate result among the three results for each range of T1 is finally adopted.

When the imaging parameters are set by default, a plurality of imaging parameter sets of four points having different TIs may be set for each region or organ such as for head, chest, and abdomen. Generally, since an imaging region and the like are set at the time of imaging, the imaging parameter setting unit 22 automatically selects and sets any one of the plurality of imaging parameter sets from the set region or the like.

As the default, instead of setting all imaging conditions, for example, the number of acquired images may be fixed, and only TI may be received by the user. Or, a plurality of TIs and acquisition order may be fixed, and the user specification regarding the number of acquired images may be received.

The imaging parameters set by default may be displayed on the UI screen, and at that time, a change by the user or the user specification regarding the measurement time may be received. The imaging parameter setting unit 22 receives the change by the user or a new user specification and adjusts the set imaging parameters.

EXAMPLE

Figure 12B:
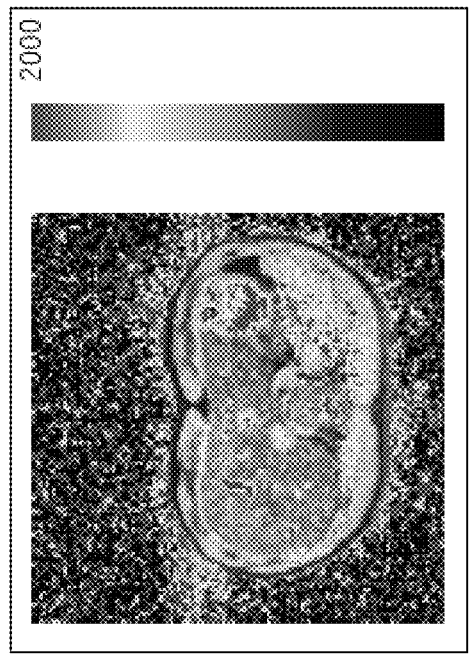
FIGS. 12A and 12B are diagrams illustrating results of the T1 map measurement of the first embodiment.
Figure 12A:
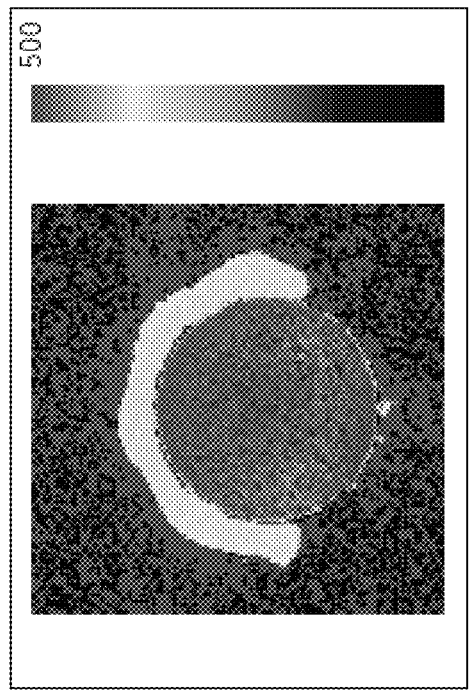

FIGS. 12A and 12B illustrate the results of the T1 map measurement performed by the T1 map measurement method of the present embodiment. FIG. 12A illustrates the results of T1 map measurement performed with the number of acquired images being 3 (TI0=−600 ms, TI1=200 ms, TI2=600 ms) on the phantom, and FIG. 12B illustrates the results thereof on the human abdomen. As illustrated in the figure, a high-accuracy T1 map was obtained with a small number of image acquisitions by the T1 map measurement method of the present embodiment.

According to the present embodiment, it is possible to reduce the number of signal acquisition sequences after the pre-pulse by including the sequence for acquiring the image of TI0 before the pre-pulse as the imaging sequence for the T1 map measurement, thereby improving the accuracy of the T1 calculation and reducing the imaging time. Further, according to the present embodiment, it is possible to perform the T1 map measurement in which appropriate imaging parameters are set according to the T1 value of the tissue and the imaging purpose, and to improve the accuracy of the calculated T1 map.

Second Embodiment

The present embodiment is the same as the first embodiment in that the imaging sequence, in which the signal acquisition sequence is executed before the application of the pre-pulse, is executed in the T1 map measurement. However, in the present embodiment, the B1 map or T2* map measurement is performed simultaneously with the T1 map measurement using the signal acquired in the signal acquisition sequence before the application of the pre-pulse.

Hereinafter, the MRI apparatus of the present embodiment will be described focusing on differences from the first embodiment.

Figure 13:
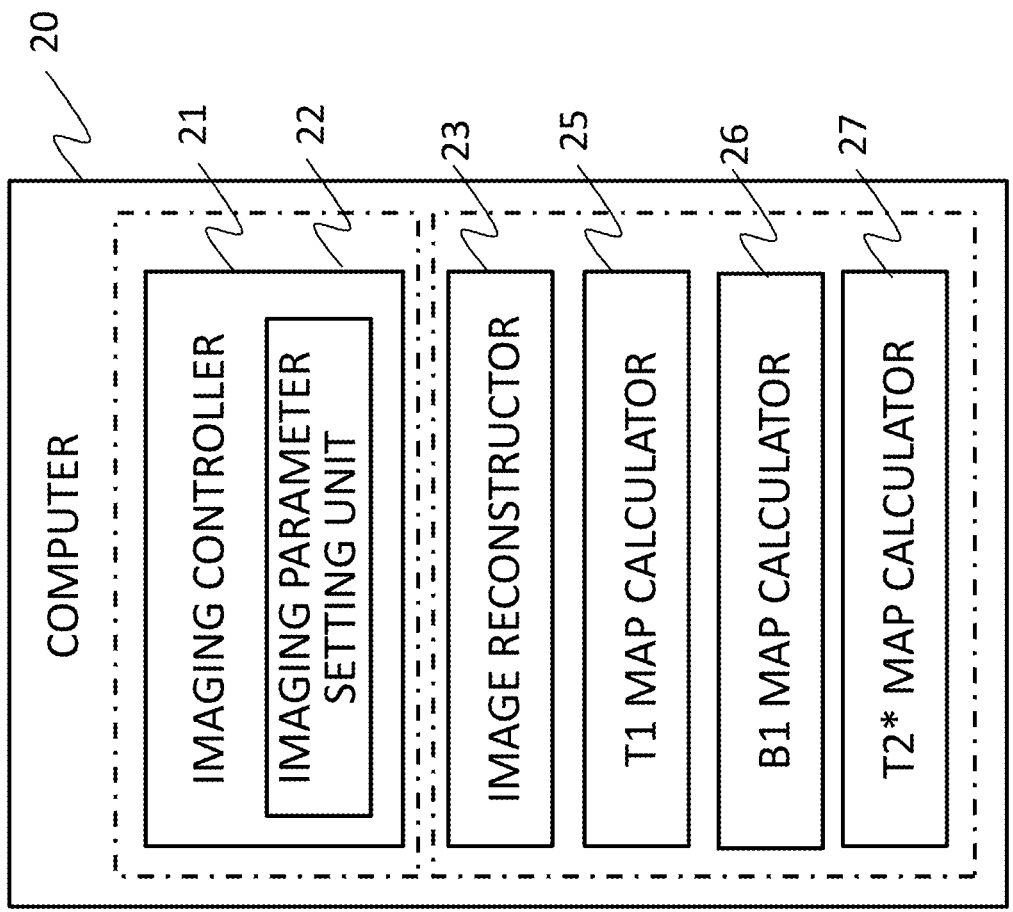
FIG. 13 is a functional block diagram of the computer (CPU) of the MRI apparatus of a second embodiment.

FIG. 13 is a block diagram of the computer (CPU) of the MRI apparatus according to the present embodiment. In FIG. 13, the same functional units as those of the CPU (FIG. 2) of the first embodiment are denoted by the same reference numerals, and redundant description will be omitted. As illustrated in the figure, the CPU 20 of the present embodiment has a B1 map calculator 26 and a T2* map calculator 27 added to the calculator. However, only one of the B1 map calculator 26 and the T2* map calculator 27 may be used.

[B1 Map Measurement]

The imaging sequence when adding the B1 map measurement is the same as the imaging sequence illustrated in FIGS. 4 and 8, and the signal acquisition sequence of two or more points is executed as the signal acquisition sequence after the application of the pre-pulse. However, the interval $\Delta T$ between the signal acquisition sequence before the application of the pre-pulse and the pre-pulse is set longer than when only the T1 map measurement is performed. In the T1 map measurement, a length of the interval $\Delta T$ does not affect the accuracy of the T1 map, however, more accurate measurement can be performed as the interval is longer in the B1 map.

Other imaging parameters are the same as those in the first embodiment, in which the interval from the pre-pulse 500 to the signal acquisition sequence of TI1 is made as short as possible (for example, 10 ms), and the interval ($\Delta T$) between the signal acquisition sequences 502 and 503 is made as long as possible. If the interval ($\Delta T$) between the image acquisitions cannot be increased due to the TI to be set, the number of shots of the pre-pulse 500 is increased, to increase the interval between the image acquisitions as in the imaging sequence of FIG. 8.

The B1 map calculator 26 solves the above-described simultaneous equation of the longitudinal relaxation using the signal values of the three images (TI0 image, TI1 image, and TI2 image or TI3 image) acquired by the imaging pulse sequence, to obtain FA (B1 value).

[T2* Map Measurement]

Figure 14:
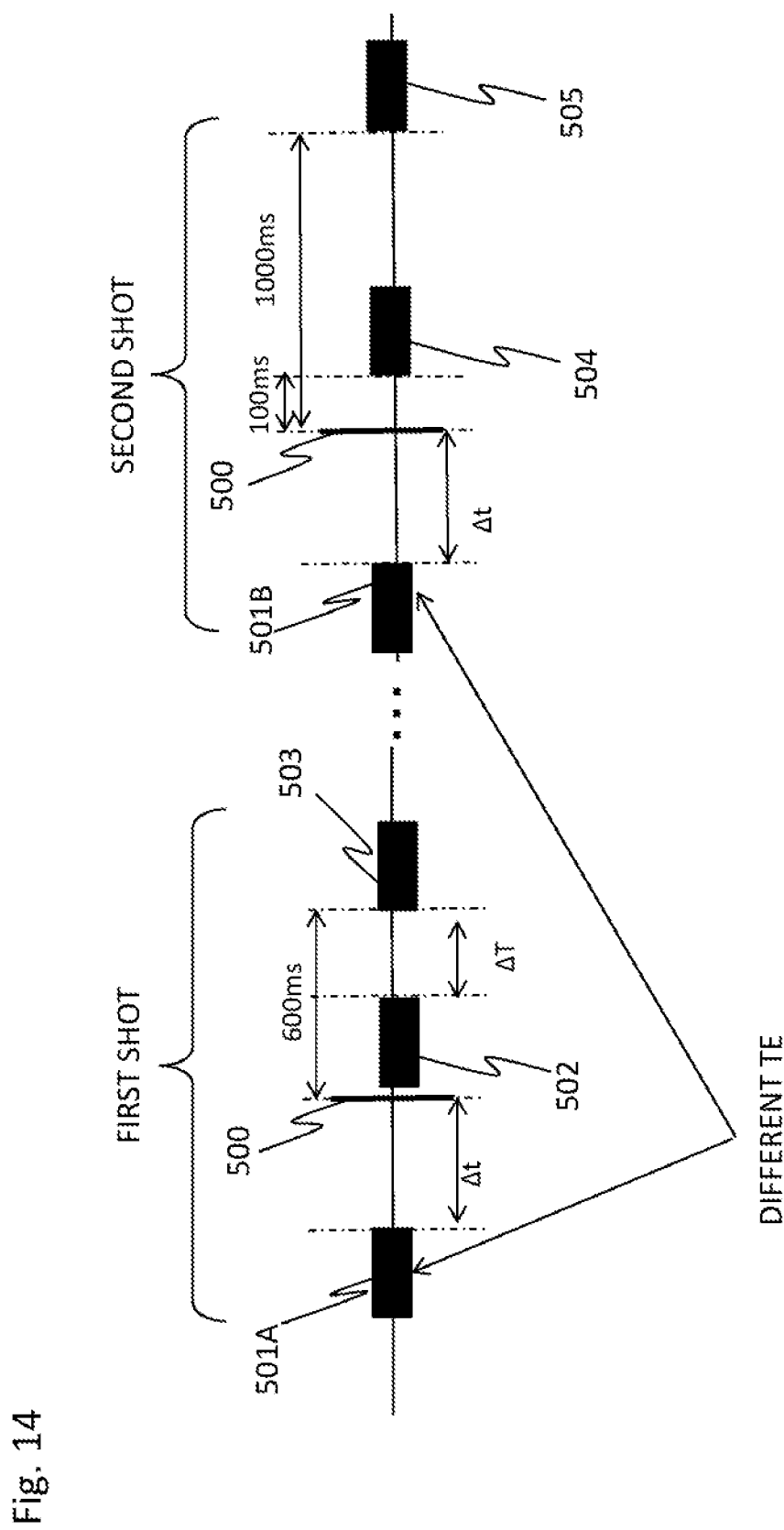
FIG. 14 is a diagram illustrating an example of the imaging sequence of the second embodiment.

On the other hand, in the imaging sequence when the T2* map measurement is added, the signal acquisition sequence (TI0 image acquisition) 501 executed before the application of the pre-pulse is repeated with different echo times (TE). Other conditions are the same as in the case of the T1 map measurement. For example, in the imaging sequence of FIG. 8, the TI0 signal acquisition sequence executed prior to the pre-pulse irradiation has the same conditions, however, in the imaging sequence illustrated in FIG. 14, the TI0 signal acquisition sequences 501A, 501B, - - - are executed for each pre-pulse shot with different echo times TE.

Assuming that the number of shots is n, n TI0 images with different echo times are acquired. The signal values of the images can be expressed by the following equation (2).

$$S(TI0) \propto M0 \times e^{-TE/T2^*} \quad (2)$$

From a plurality of signal values with different TEs, T2* can be expressed by the following equations (3-1) and (3-2). The T2* map calculator 27 calculates T2* by performing fitting based on this equation.

$$\frac{S(T10)_{TE1}}{S(T10)_{TE2}} = \frac{e^{-TE1/T2^*}}{e^{-TE2/T2^*}} = e^{(-TE1/T2^* + TE2/T2^*)} = e^{\frac{TE2-TE1}{T2^*}} \quad (3-1)$$

$$T2^* = \frac{TE2 - TE1}{\log \frac{S(T10)_{TE1}}{S(T10)_{TE2}}} \quad (3-2)$$

The T1 map calculation is the same as that of the first embodiment. However, when the signal acquisition sequences 502 and 503 (504 and 505) having different TI values are executed for each shot of the pre-pulse 500 as in the imaging sequence illustrated in FIG. 14, the T1 value can be calculated from a combination that can most accurately determine the T1 value using a plurality of combinations as a combination of the three images. However, when the range of the target T1 value is narrow, the image acquisition of the same combination may be repeated.

Further, when measuring both the B1 map and the T2* map together with the T1 map, in the above-described imaging sequence for the T2* map measurement, the conditions for the B1 map measurement, that is, increasing the interval between the TI0 signal acquisition sequence 501 and the pre-pulse 500 is added.

The MRI apparatus of the present embodiment can also be configured so that the user selects addition of the B1 map measurement or the T2* map measurement through the UI unit.

According to the present embodiment, the B1 map measurement and the T2* map measurement can be performed by adding conditions based on the imaging sequence for the T1 map measurement, so that the measurement time can be remarkably reduced compared with when they are independently measured.

Third Embodiment

The MRI apparatus of the present embodiment performs the T1 map measurement by electrocardiographic synchronization. Therefore, in the MRI apparatus of the present embodiment, the CPU is provided with a synchronization signal input unit for inputting an output of an electrocardiograph or the like (not shown) attached to the subject 1 (FIG. 1) as a synchronization signal, and the imaging controller 21 controls the imaging sequence for the T1 map measurement using the synchronization signal.

Figure 15:
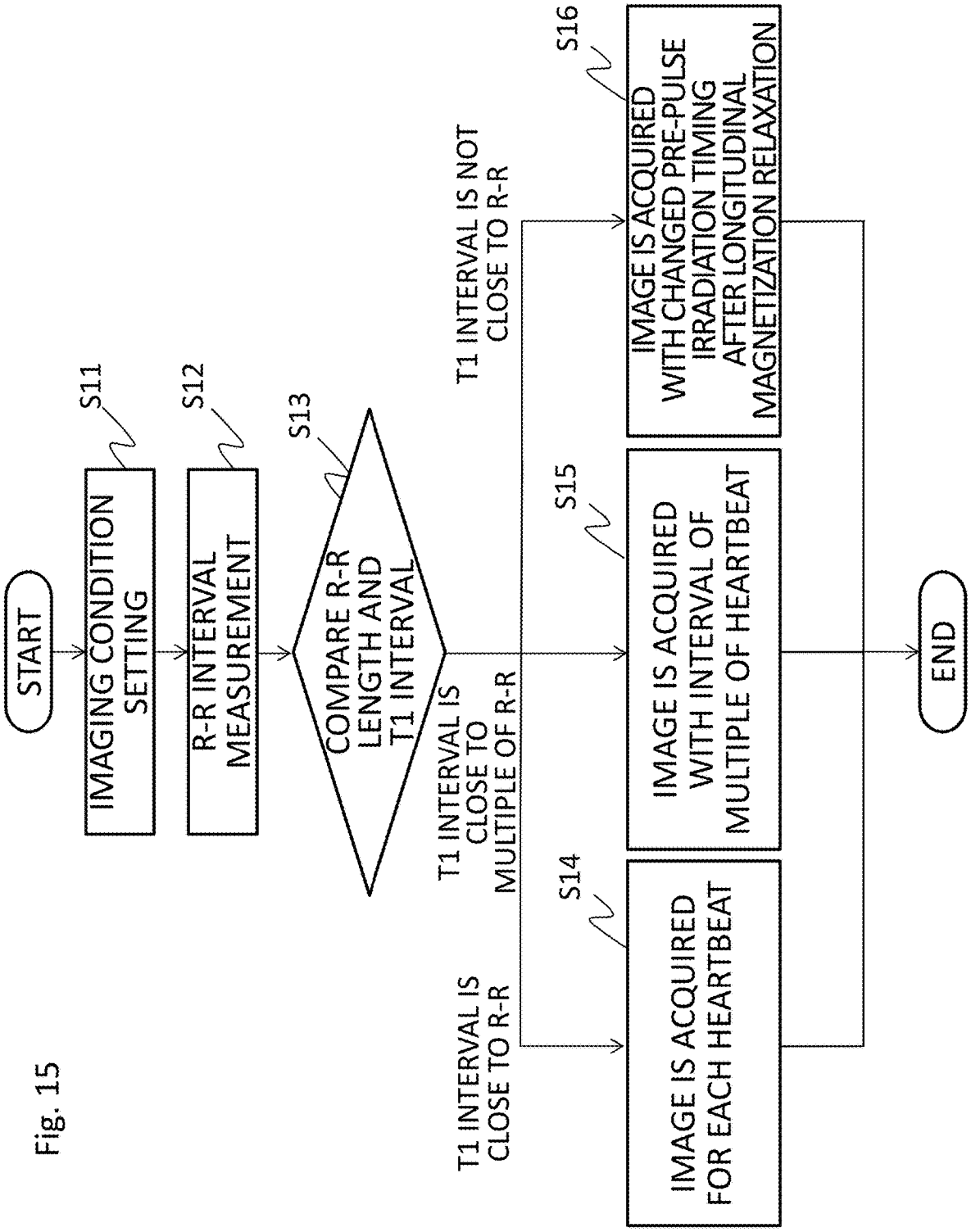
FIG. 15 is a diagram illustrating a procedure of imaging control of a third embodiment.

Hereinafter, the differences from the first and second embodiments will be described. FIG. 15 illustrates a flow of control by the imaging controller 21, and FIGS. 16 and 17 illustrate an example of the imaging sequence according to the present embodiment.

First, as in the first embodiment, the imaging controller 21 sets the imaging sequence for acquiring the TI0 image, and the plurality of images such as the TI1 image and the TI2 image after the application of the pre-pulse, and determines the imaging parameters (TI, TR and the like) (S11). In the imaging sequence, for example, as illustrated in FIG. 7, it is assumed to acquire the images of two points (TI1 and TI2) having different TIs in addition to TI0. In the electrocardiographic synchronization, the time from an R-wave to start of each signal acquisition sequence is equalized.

When the signal from the electrocardiograph is input, the imaging controller 21 measures the interval (length of one heartbeat) between R-waves and calculates an average value thereof (S12). Comparing the calculated length (R-R) of one heartbeat with TI, if the interval between TI1 and TI2 is close to R-R, the interval between acquisitions of the TI0 image, the TI1 image, and the TI2 image is set to one heartbeat (S13, S14) (FIG. 16). When the interval between TI1 and TI2 is close to a multiple of R-R, the interval between acquisitions of the TI1 image and the TI2 image is set to the multiple of the heartbeat (S13, S15) (FIG. 17). When the interval between TI1 and TI2 is not close to R-R, after the time has elapsed after the TI1 image was acquired, and the longitudinal magnetization is relaxed, the TI2 image is acquired after irradiating a pre-pulse 504. At this time, an intended TI2 image acquisition timing is set by adjusting a timing of irradiation of the pre-pulse 504 (S13, S16) (FIG. 18).

Starting imaging after setting the imaging conditions, and calculating the T1 map from the acquired image is the same as in the other embodiments (S16).

Also in the present embodiment, in Step S11 of setting the imaging conditions, the plurality of TIs, the number and interval of signal acquisition sequences (acquired images), the number of shots, and the like may be set depending on T1 of the imaging target and the required accuracy or may be determined by the user specification.

The T1 map is useful for evaluation of myocardial properties, and the present embodiment can improve accuracy of the evaluation of myocardial properties.

Although the embodiments of the MRI apparatus and a method for controlling the apparatus of the present invention have been described above, the above embodiments can be appropriately combined and performed as long as there is no technical inconsistency. For example, when performing the electrocardiographic synchronization, it is possible to perform not only the T1 map measurement but also the T2* map measurement, and the conditions can be set by default, or adjusted or changed by user specification.

What is claimed is:

1. A magnetic resonance imaging apparatus comprising:
   an imaging unit that collects nuclear magnetic resonance signals; and
   an imaging controller that controls the imaging unit according to a predetermined pulse sequence, wherein
   the pulse sequence includes a pulse sequence for T1 map measurement that includes a first signal acquisition sequence and a plurality of signal acquisition sequences executed after application of an inverted pulse and at different signal acquisition times from the inverted pulse, and
   the imaging controller controls imaging conditions of each of the plurality of signal acquisition sequences depending on a T1 value of an imaging target and its required accuracy.

2. The magnetic resonance imaging apparatus according to claim 1, wherein
   the imaging conditions include at least one of the signal acquisition time from the inverted pulse, the number of signal acquisition sequences executed after the application of the inverted pulse, an interval between the plurality of signal acquisition sequences, and a signal acquisition time.

3. The magnetic resonance imaging apparatus according to claim 1, further comprising
a storage unit for storing a relationship between the T1 value and information on its accuracy and the imaging conditions of the pulse sequence for the T1 map measurement, wherein
the imaging controller controls the imaging conditions of the pulse sequence for the T1 map measurement using the relationship stored in the storage unit.

4. The magnetic resonance imaging apparatus according to claim 1, further comprising
a calculator that performs calculation including T1 map calculation using a nuclear magnetic resonance signal acquired by executing the pulse sequence for the T1 map measurement, wherein
the calculator calculates the T1 map by a calculation method depending on the number of the plurality of signal acquisition sequences.

5. The magnetic resonance imaging apparatus according to claim 4, wherein
the calculator further calculates a B1 map using the nuclear magnetic resonance signal acquired by executing the pulse sequence for the T1 map measurement.

6. The magnetic resonance imaging apparatus according to claim 4, wherein
the pulse sequence for the T1 map measurement further includes an additional signal acquisition sequence of the same type as the first signal acquisition sequence and having a different echo time from the first signal acquisition sequence, and
the calculator calculates a T2* map using the nuclear magnetic resonance signals acquired in the first signal acquisition sequence and the additional signal acquisition sequence.

7. The magnetic resonance imaging apparatus according to claim 1, further comprising
a user interface that receives a user specification regarding the T1 value of the imaging target and the required accuracy, wherein
the imaging controller controls the imaging conditions of the pulse sequence for the T1 map measurement according to the user specification received by the user interface.

8. The magnetic resonance imaging apparatus according to claim 7, wherein
the user interface receives a T1 value range as the T1 value of the imaging target.

9. The magnetic resonance imaging apparatus according to claim 7, wherein
the user interface receives a range of a discriminable T1 value as the required accuracy.

10. The magnetic resonance imaging apparatus according to claim 7, wherein
the user interface receives a region of an inspection target and an inspection name as the user specification.

11. The magnetic resonance imaging apparatus according to claim 1, further comprising
a synchronization signal input unit that receives synchronization signals related to heartbeats collected from an inspection target during imaging, wherein
the imaging controller controls the imaging unit such that signal acquisition times in the plurality of signal acquisition sequences are identical or close cardiac time phases.

12. A magnetic resonance imaging apparatus comprising:
an imaging unit that collects nuclear magnetic resonance signals; and
an imaging controller that controls the imaging unit according to a predetermined pulse sequence, wherein
the pulse sequence includes a pulse sequence for T1 map measurement that includes a first signal acquisition sequence and a plurality of signal acquisition sequences executed after application of an inverted pulse and at different signal acquisition times from the inverted pulse,
the pulse sequence for the T1 map measurement includes a second and third signal acquisition sequences executed after application of a first inverted pulse and at different signal acquisition times from the first inverted pulse, and a fourth and fifth signal acquisition sequences executed after application of a second inverted pulse and at different signal acquisition times from the second inverted pulse, and
the signal acquisition times of the fourth and fifth signal acquisition sequences are respectively different from the signal acquisition times of the second and third signal acquisition sequences.

13. The magnetic resonance imaging apparatus according to claim 12, wherein
the imaging controller controls imaging conditions of each of the plurality of signal acquisition sequences depending on a T1 value of an imaging target and its required accuracy.

14. The magnetic resonance imaging apparatus according to claim 13, wherein
the imaging conditions include at least one of the signal acquisition time from the inverted pulse, the number of signal acquisition sequences executed after the application of the inverted pulse, an interval between the plurality of signal acquisition sequences executed after the application of the inverted pulse, and a signal acquisition time.

15. A method for controlling the magnetic resonance imaging apparatus that executes a pulse sequence for T1 map measurement that includes a first signal acquisition sequence and a plurality of signal acquisition sequences executed after application of an inverted pulse and at different signal acquisition times from the inverted pulse, comprising:
a step of receiving information on a T1 value of an imaging target and its required accuracy; and
a step of determining the pulse sequence for the T1 map measurement based on a relationship between information on a previously stored T1 value and its accuracy and imaging conditions of the pulse sequence for the T1 map measurement, wherein
the imaging conditions include any one of the signal acquisition time from the inverted pulse, the signal acquisition time, and the number of signal acquisition sequences, of each of the plurality of signal acquisition sequences.

* * * * *